United States Patent
Chuang et al.

(10) Patent No.: US 9,411,364 B2
(45) Date of Patent: Aug. 9, 2016

(54) ELECTRONIC ASSEMBLY AND ELECTRONIC APPARATUS

(71) Applicant: HTC Corporation, Taoyuan County (TW)

(72) Inventors: I-Cheng Chuang, Taoyuan County (TW); Chien-Hung Chen, Taoyuan County (TW); Cheng-Te Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 381 days.

(21) Appl. No.: 14/064,221

(22) Filed: Oct. 28, 2013

(65) Prior Publication Data

US 2015/0116957 A1  Apr. 30, 2015

(51) Int. Cl.
*H05K 7/02* (2006.01)
*G06F 1/16* (2006.01)
*H04M 1/02* (2006.01)

(52) U.S. Cl.
CPC .............. *G06F 1/16* (2013.01); *H04M 1/0262* (2013.01); *H04M 1/0266* (2013.01); *H05K 7/023* (2013.01)

(58) Field of Classification Search
CPC ....... H05K 7/023; G06F 1/16; H04M 1/0262; H04M 1/0266
USPC ......................................................... 361/748
See application file for complete search history.

(56) References Cited

U.S. PATENT DOCUMENTS

| | | | |
|---|---|---|---|
| 5,426,564 A * | 6/1995 | Hsu ........................ | G06F 1/1616 361/679.4 |
| 5,515,303 A * | 5/1996 | Cargin, Jr. ............... | B60R 11/02 235/375 |

(Continued)

FOREIGN PATENT DOCUMENTS

| CN | 201976357 | 9/2011 |
|---|---|---|
| CN | 202602735 | 12/2012 |
| CN | 202617194 | 12/2012 |

*Primary Examiner* — Jeremy C Norris
*Assistant Examiner* — Nathan Milakovich
(74) *Attorney, Agent, or Firm* — Jianq Chyun IP Office

(57) ABSTRACT

An electronic apparatus includes a rear casing, a front cover, and an electronic assembly that includes a display module, a host module, a battery module, and an expansion module. The rear casing has a front opening. The front cover is located on the front opening; the front cover and the rear casing together constitute an accommodation space. The display module is installed inside the accommodation space and stacked over the front cover. The host module is installed inside the accommodation space and stacked over the display module. The battery module is installed inside the accommodation space, stacked over the display module, and arranged side by side with the host module. The expansion module is installed inside the accommodation space and stacked over the battery module. The expansion module includes an expansion circuit board stacked over the battery module and a plurality of card connectors mounted on the expansion circuit board.

14 Claims, 5 Drawing Sheets

(56) References Cited

U.S. PATENT DOCUMENTS

| | | | | |
|---|---|---|---|---|
| 6,244,894 B1* | 6/2001 | Miyashita | H04B 1/3816 | 439/500 |
| 6,560,092 B2* | 5/2003 | Itou | G06F 1/1626 | 108/43 |
| 6,842,333 B2* | 1/2005 | Lee | G06F 1/1626 | 312/223.2 |
| 6,931,266 B2* | 8/2005 | Miyoshi | H04B 1/3883 | 455/343.1 |
| 7,715,189 B2* | 5/2010 | Iida | G06F 1/1616 | 361/679.31 |
| 7,921,553 B2* | 4/2011 | Wojack | G06Q 30/0214 | 29/832 |
| 8,279,587 B2* | 10/2012 | Wang | G06F 1/16 | 165/104.33 |
| 8,570,736 B2* | 10/2013 | McClure | G06F 1/1626 | 320/135 |
| 8,968,030 B2* | 3/2015 | Zhang | H05K 5/0286 | 439/630 |
| 2001/0044281 A1 | 11/2001 | Peterzell et al. | | |
| 2004/0042168 A1* | 3/2004 | Yang | G06F 1/1626 | 361/679.33 |
| 2006/0094466 A1* | 5/2006 | Tran | H04B 1/3877 | 455/558 |
| 2011/0186345 A1* | 8/2011 | Pakula | G06F 1/1626 | 174/520 |
| 2014/0327630 A1* | 11/2014 | Burr | G06F 3/0488 | 345/173 |

\* cited by examiner

US 9,411,364 B2

ELECTRONIC ASSEMBLY AND ELECTRONIC APPARATUS

BACKGROUND OF THE INVENTION

1. Field of the Invention

The invention relates to an electronic apparatus. More particularly, the invention relates to an electronic assembly and an electronic apparatus employing the electronic assembly.

2. Description of Related Art

Recently, with the progress of science and technology, handheld apparatuses including smart phones and tablet computers have been extensively applied and have become more convenient, multi-functional, and stylish, thus providing consumers with more options. Together with the increasing demands of users for the handheld apparatuses, the users tend to hold the handheld apparatuses for a longer and longer period of time. Therefore, the comfort of holding the handheld apparatuses is also increasingly important. To improve the comfort of holding the handheld apparatuses, the casings of the handheld apparatus are often designed to have curved surfaces in compliance with ergonomic requirements.

Some handheld apparatuses are equipped with built-in card connectors where small electronic cards (e.g., SIM cards, memory cards including secure digital (SD) memory cards, and so on) may be inserted. If the number of the card connectors increases, the area occupied by the motherboards of the electronic apparatuses is often expanded to accommodate the card connectors, which however leads to the increase in the volume of the handheld apparatuses.

SUMMARY OF THE INVENTION

The invention provides an electronic assembly adapted to an electronic apparatus for increasing a curvature of the appearance of the electronic apparatus or reducing the overall thickness of the electronic apparatus.

The invention provides an electronic apparatus whose appearance has an increased curvature or an electronic apparatus with a reduced thickness as a whole.

The invention provides an electronic assembly that includes a display module, a host module, a battery module, and an expansion module is provided. The host module is stacked over the display module and includes a processing unit and a memory unit. The battery module is stacked over the display module and arranged side by side with the host module. The expansion module is stacked over the battery module. Besides, the expansion module includes an expansion circuit board and a plurality of card connectors. The expansion circuit board is stacked over the battery module. The card connectors are mounted on the expansion circuit board.

The invention provides an electronic apparatus that includes a rear casing, a front cover, and an electronic assembly is provided. The rear casing has a front opening. The front cover is located on the front opening; the front cover and the rear casing together constitute an accommodation space. The electronic assembly includes a display module, a host module, a battery module, and an expansion module. The display module is installed inside the accommodation space and stacked over the front cover. The host module is installed inside the accommodation space and stacked over the display module. The battery module is installed inside the accommodation space, stacked over the display module, and arranged side by side with the host module. The expansion module is installed inside the accommodation space and stacked over the battery module. Besides, the expansion module includes an expansion circuit board and a plurality of card connectors. The expansion circuit board is stacked over the battery module. The card connectors are mounted on the expansion circuit board.

In light of the foregoing, in the invention, the host module and the battery module are arranged side by side on the display module, and the expansion module is stacked over the battery module, such that the curvature of the appearance of the rear casing may be increased, and the overall thickness of the electronic apparatus may be reduced.

Several exemplary embodiments accompanied with figures are described in detail below to further describe the invention in details.

DETAILED DESCRIPTION OF DISCLOSED EMBODIMENTS

Figure 1:
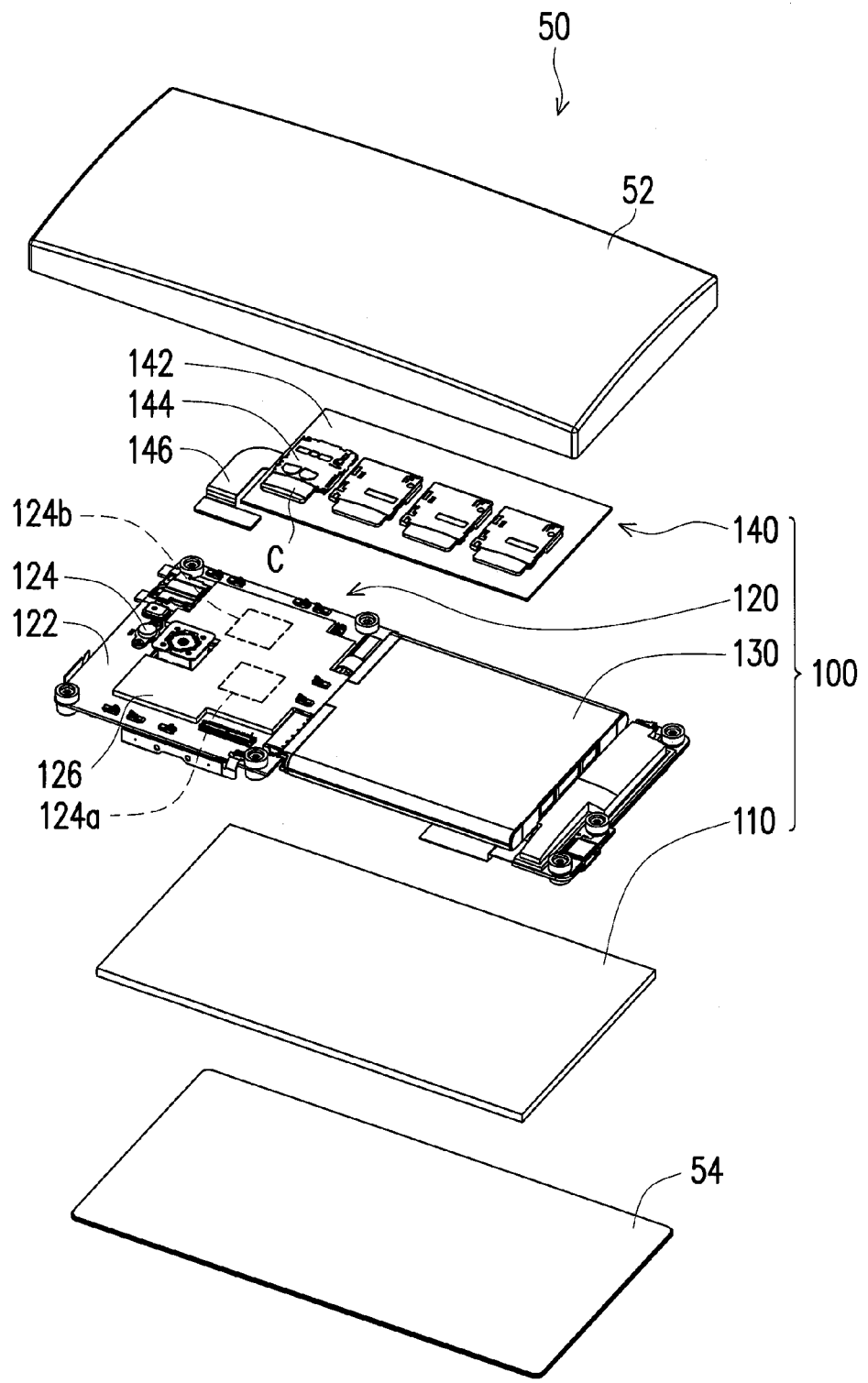
FIG. 1 is a rear exploded view illustrating an electronic apparatus according to an embodiment of the invention.
Figure 2:
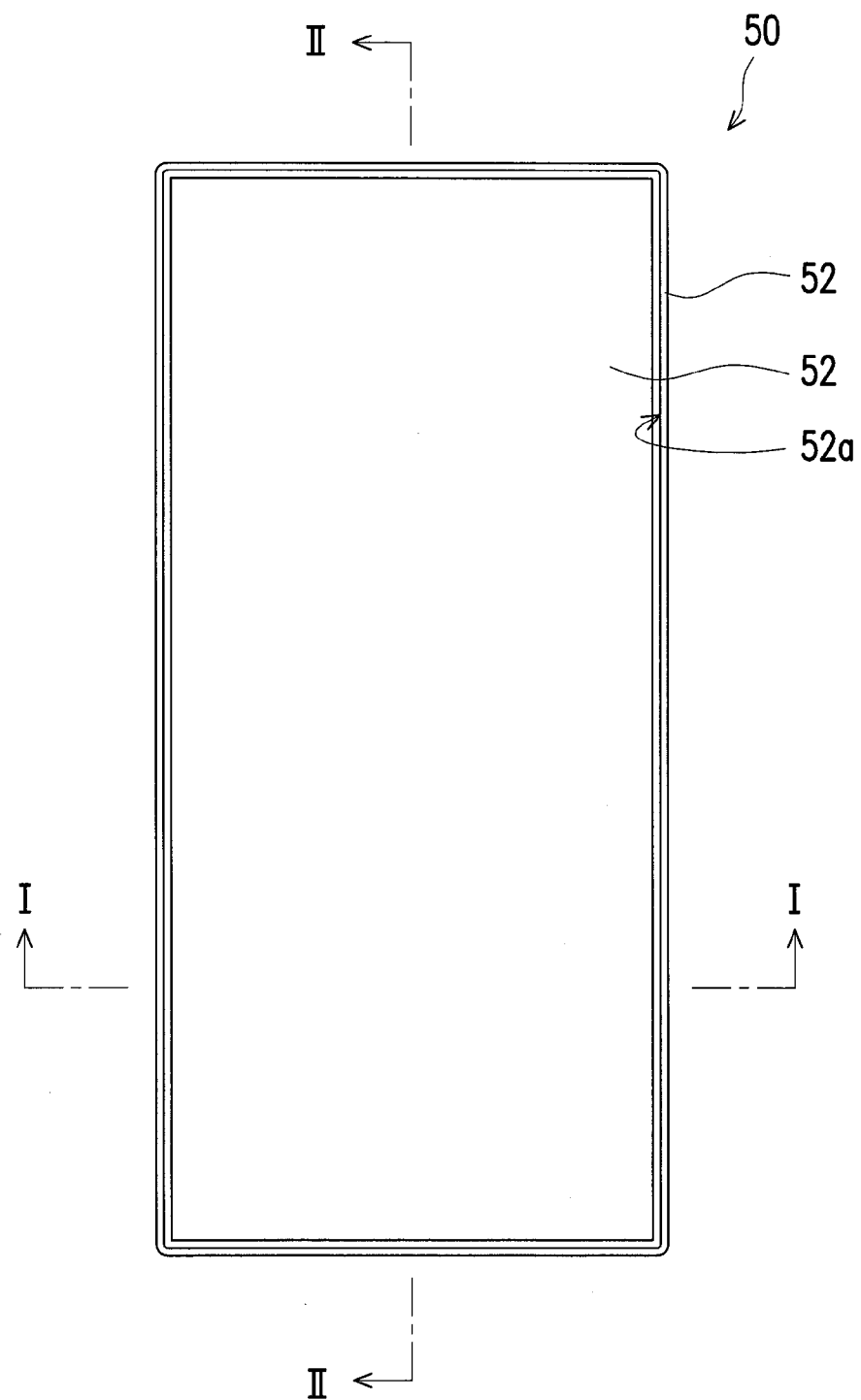
FIG. 2 is a front view illustrating the electronic apparatus depicted in FIG. 1 after assembly.
Figure 3:
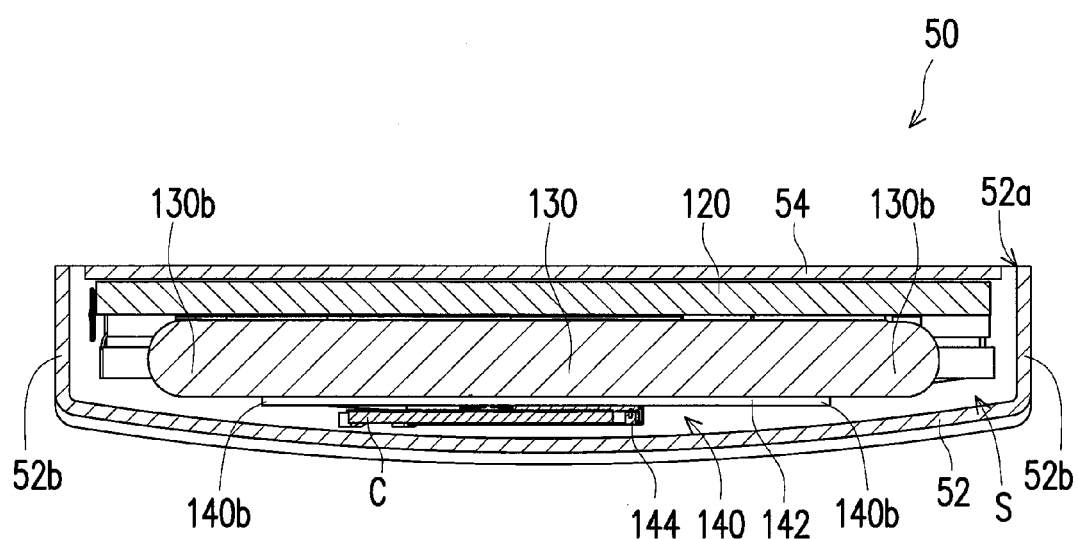
FIG. 3 is an enlarged cross-sectional view illustrating the electronic apparatus depicted in FIG. 2 along a line I-I.
Figure 4:
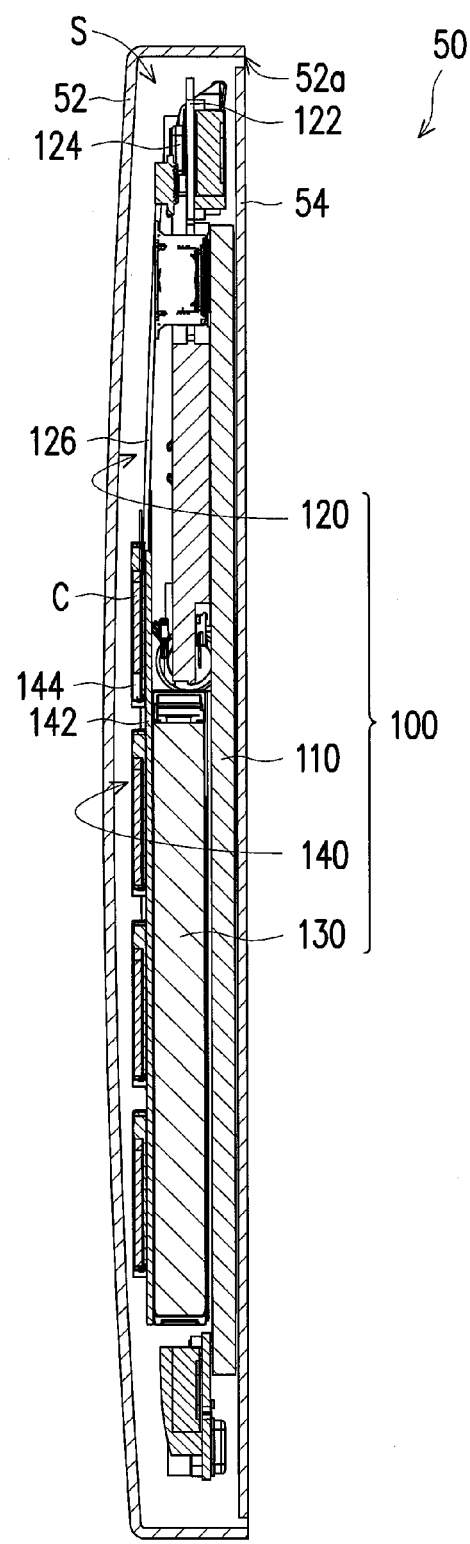
FIG. 4 is an enlarged cross-sectional view illustrating the electronic apparatus depicted in FIG. 2 along a line II-II.

FIG. 1 is a rear exploded view illustrating an electronic apparatus according to an embodiment of the invention. FIG. 2 is a front view illustrating the electronic apparatus depicted in FIG. 1 after assembly. FIG. 3 is an enlarged cross-sectional view illustrating the electronic apparatus depicted in FIG. 2 along a line I-I. FIG. 4 is an enlarged cross-sectional view illustrating the electronic apparatus depicted in FIG. 2 along a line II-II. With reference to FIG. 1 to FIG. 4, the electronic apparatus 50 described in the present embodiment is a smart phone, a tablet computer, or any other similar electronic apparatus, for instance. The electronic apparatus 50 includes a rear casing 52, a front cover 54, and an electronic assembly 100. The rear casing 52 has a front opening 52a, and the front cover 54 (e.g., a glass panel) is located on the front opening 52a. The front cover 54 and the rear casing 52 constitute an accommodation space S, as shown in FIG. 3 and FIG. 4. The electronic assembly 100 is configured in the accommodation space S.

The electronic assembly 100 includes a display module 110, a host module 120, a battery module 130, and an expansion module 140. The display module 110 is installed inside the accommodation space S and stacked over the front cover 54. Images generated by the display module 110 may be observed by users through the front cover 54. The display module 110 is, for instance, a liquid crystal display (LCD) module or an organic light-emitting diode (OLED) component, and a transparent touch circuit may be built in or externally configured onto the display module 110, so as to perform a touch function as well.

The host module 120 is installed inside the accommodation space S and stacked over the display module 110. The display module 110 is electrically connected to the host module 120. The host module 120 may include a host circuit board 122, a plurality of electronic parts 124, and a shielding cover 126. The host circuit board 122 is stacked over the display module 110 and arranged side by side with the battery module 130. The electronic parts 124 are stacked on (e.g., welded onto) the host circuit board 122; that is, the electronic parts 124 are stacked on two sides of the host circuit board 122. In the present embodiment, the electronic parts 124 include a processing unit 124a (e.g., a central processing unit) and a memory unit 124b (e.g., a memory module). The shielding cover 126 is stacked on (e.g., welded onto) the host circuit board 122 and covers some of the electronic parts 124.

The battery module 130 is installed inside the accommodation space S, stacked over the display module 110, and arranged side by side with the host module 120. Here, the battery module 130 is a lithium battery or any other thin battery, for instance.

The expansion module 140 is installed inside the accommodation space S and stacked over the battery module 130. The expansion module 140 may be further stacked over the host module 120 and the battery module 130. Besides, a width of the expansion module 140 is less than a width of the battery module 130, and the width of the battery module 130 is less than a width of the display module 110. Additionally, the width of the display module 110 is less than a width of the front cover 54. A portion (e.g., the bottom) of the rear casing 52 extends along a curved surface; as the widths of the aforesaid components decrease, the curvature of the appearance of the rear casing 52 may increase. In comparison with a corresponding edge 140b of the expansion module 140 along a width direction of the expansion module 140, an edge 130b of the battery module 130 along a width direction of the battery module 130 is closer to a corresponding side wall 52b of the rear casing 52.

The expansion module 140 includes an expansion circuit board 142 and a plurality of card connectors 144. The expansion circuit board 142 is stacked over the battery module 130, and the card connectors 144 are stacked on (e.g., welded onto) the expansion circuit board 142. Small electronic cards C (e.g., SIM cards or SD memory cards) may be inserted into the card connectors 144. A width of each of the card connectors 144 is less than a width of the expansion circuit board 142, and the width of the expansion circuit board 142 is less than a width of the battery module 130 Similarly, the decrease in the widths of the aforesaid components leads to the increase in the curvature of the appearance of the rear casing 52.

The expansion module 140 includes a flexible circuit board 146 configured to be connected to the host module 120. According to the present embodiment, the flexible circuit board 146 is connected to the expansion circuit board 142 and the host circuit board 122, so as to achieve the electrical connection between the expansion module 140 and the host module 120.

The expansion module 140 described in the present embodiment is stacked over the host module 120 and the battery module 130. However, in another embodiment that is not shown in the drawings, as long as the overall thickness of the host module 120 is greater than the thickness of the battery module 130, the expansion module 140 may not be stacked over the host module 120 but may merely be stacked over the battery module 130.

Figure 5:
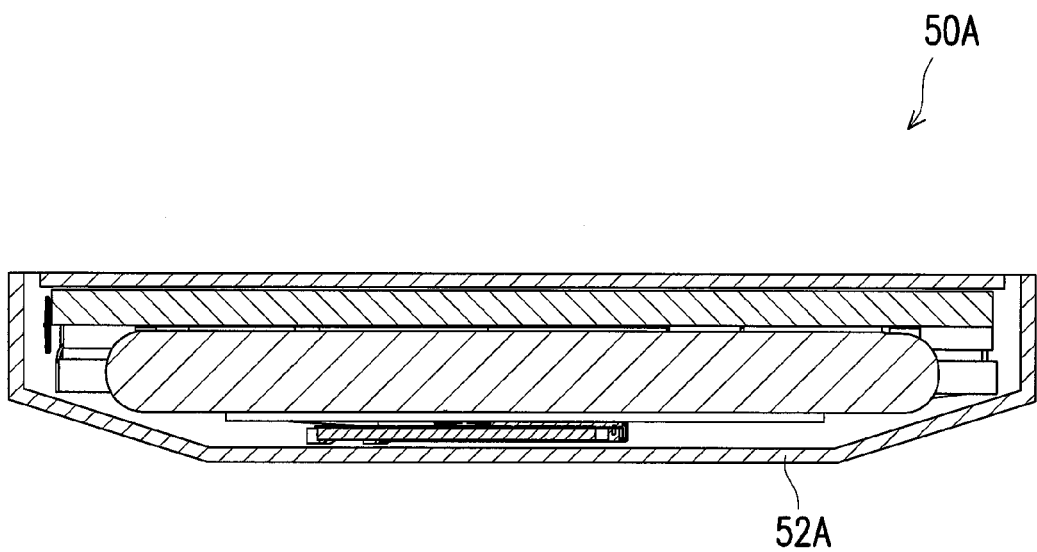
FIG. 5 is a cross-sectional view illustrating an electronic apparatus according to another embodiment of the invention.

As shown in FIG. 3, a portion (e.g., the bottom) of the rear casing 52 extends along a curved surface. Nevertheless, with reference to FIG. 5, in the electronic apparatus 50A described in another embodiment of the invention, a portion (e.g., the bottom) of the rear casing 52 may extend along an inclined surface. To sum up, in the invention, the host module and the battery module are arranged side by side on the display module, and the expansion module is stacked over the battery module, such that the curvature of the appearance of the rear casing may be increased, and the overall thickness of the electronic apparatus may be reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic assembly comprising:
a display module;
a host module stacked over the display module and comprising a processing unit and a memory unit;
a battery module stacked over the display module and arranged side by side with the host module; and
an expansion module stacked over the host module and the battery module, wherein the expansion module comprises an expansion circuit board and a plurality of card connectors, the expansion circuit board is stacked over the host module and the battery module, and the card connectors are mounted on the expansion circuit board.

2. The electronic assembly as recited in claim 1, wherein a width of the expansion circuit board is less than a width of the battery module, and the width of the battery module is less than a width of the display module.

3. The electronic assembly as recited in claim 1, wherein the host module comprises:
a main circuit board stacked over the display module and arranged side by side with the battery module;
a plurality of electronic components stacked on the host circuit board, wherein the electronic components comprises the processing unit and the memory unit; and
a shielding cover stacked on the host circuit board.

4. The electronic assembly as recited in claim 1, wherein a width of each of the card connectors is less than a width of the expansion circuit board, and the width of the expansion circuit board is less than a width of the battery module.

5. The electronic assembly as recited in claim 1, wherein the expansion module has a flexible circuit board configured to be connected to the host module.

6. An electronic apparatus comprising:
a rear casing having a front opening;
a front cover located on the front opening, the front cover and the rear casing constituting an accommodation space;
an electronic assembly comprising:
a display module installed inside the accommodation space and stacked over the front cover;
a host module installed inside the accommodation space and stacked over the display module;
a battery module installed inside the accommodation space, stacked over the display module, and arranged side by side with the host module; and
an expansion module installed inside the accommodation space and stacked over the host module and the battery module, the expansion module comprising an expansion circuit board and a plurality of card connectors, wherein the expansion circuit board is stacked over the host module and the battery module, and the card connectors are arranged on the expansion circuit board.

7. The electronic apparatus as recited in claim 6, wherein a width of the expansion module is less than a width of the battery module, and the width of the battery module is less than a width of the display module.

8. The electronic apparatus as recited in claim 7, wherein the width of the display module is less than a width of the front cover.

9. The electronic apparatus as recited in claim 6, wherein the host module comprises:
- a host circuit board stacked over the display module and arranged side by side with the battery module;
- a plurality of electronic parts stacked on the host circuit board, the electronic parts comprising a processing unit and a memory unit; and
- a shielding cover stacked on the host circuit board.

10. The electronic assembly as recited in claim 6, wherein a portion of the rear casing extends along a curved surface or an inclined surface.

11. The electronic apparatus as recited in claim 6, wherein in comparison with a corresponding edge of the expansion module along a width direction of the expansion module, at least one edge of the battery module along a width direction of the battery module is closer to a corresponding side wall of the rear casing.

12. The electronic apparatus as recited in claim 6, wherein the card connectors are stacked on the expansion circuit board.

13. The electronic apparatus as recited in claim 12, wherein a width of each of the card connectors is less than a width of the expansion circuit board, and the width of the expansion circuit board is less than a width of the battery module.

14. The electronic apparatus as recited in claim 6, wherein the expansion module has a flexible circuit board configured to be connected to the host module.

* * * * *